United States Patent

Mederski

[11] Patent Number: 5,965,866
[45] Date of Patent: Oct. 12, 1999

[54] PASS CARD HAVING A SEMICONDUCTOR CHIP MODULE ATTACHED BY A MICROENCAPSULATED ADHESIVE

[75] Inventor: Gerd Mederski, Delbrück, Germany

[73] Assignee: Orga Kartensysteme GmbH, Paderborn, Germany

[21] Appl. No.: 08/750,302

[22] PCT Filed: Mar. 30, 1996

[86] PCT No.: PCT/DE96/00557

§ 371 Date: Dec. 5, 1996

§ 102(e) Date: Dec. 5, 1996

[87] PCT Pub. No.: WO96/31840

PCT Pub. Date: Oct. 10, 1996

[30] Foreign Application Priority Data

Apr. 5, 1995 [DE] Germany ............................ 195 12725

[51] Int. Cl.⁶ ............................ G06K 19/02; H01L 23/48
[52] U.S. Cl. .................. 235/492; 257/679; 257/783; 902/25; 902/26; 235/488; 156/295
[58] Field of Search ................. 235/492, 488; 257/782, 783, 784, 679, 789, 795; 902/25, 26; 156/295, 324, 283

[56] References Cited

U.S. PATENT DOCUMENTS

| | | | |
|---|---|---|---|
| 4,711,026 | 12/1987 | Swiggett et al. | 29/850 |
| 4,841,134 | 6/1989 | Hida et al. | 235/488 |
| 4,843,225 | 6/1989 | Hoppe | 235/492 |
| 5,001,542 | 3/1991 | Tsukagoshi et al. | 257/783 |
| 5,005,282 | 4/1991 | Rose | 29/827 |
| 5,013,900 | 5/1991 | Hoppe | 235/492 |
| 5,057,679 | 10/1991 | Audic et al. | 235/492 |
| 5,089,880 | 2/1992 | Meyer et al. | 257/746 |
| 5,302,456 | 4/1994 | Matsui | 428/407 |
| 5,317,191 | 5/1994 | Abe | 257/783 |
| 5,438,750 | 8/1995 | Venambre | 29/829 |
| 5,502,108 | 3/1996 | Silver et al. | 525/77 |
| 5,598,032 | 1/1997 | Fidalgo | 257/679 |
| 5,600,180 | 2/1997 | Kusaka et al. | 257/692 |
| 5,721,451 | 2/1998 | Settles et al. | 257/679 |
| 5,834,755 | 11/1998 | Haghiri-Tehrani et al. | 235/492 |
| 5,888,624 | 3/1999 | Haghiri et al. | 428/195 |

FOREIGN PATENT DOCUMENTS

| | | | |
|---|---|---|---|
| 0249266 | 12/1987 | European Pat. Off. | |
| 0334733 | 9/1989 | European Pat. Off. | |
| 0344058 | 11/1989 | European Pat. Off. | |
| 3723547 | 1/1989 | Germany. | |
| 4229639 | 12/1993 | Germany. | |
| 402034950 | 9/1988 | Japan. | |
| 3236297 | 10/1991 | Japan. | |
| 4323838 | 11/1992 | Japan | 257/783 |
| 5235096 | 9/1993 | Japan. | |

*Primary Examiner*—Donald Hajec
*Assistant Examiner*—Douglas Rodriguez
*Attorney, Agent, or Firm*—Cohen, Pontani, Lieberman & Pavane

[57] ABSTRACT

A pass card having a card body with a cavity therein, a module with a semiconductor chip implanted permanently in the cavity of the card body, and a micro-encapsulated adhesive for fixing a nonconductive plastic substrate of the module in the card body.

11 Claims, 4 Drawing Sheets

PASS CARD HAVING A SEMICONDUCTOR CHIP MODULE ATTACHED BY A MICROENCAPSULATED ADHESIVE

BACKGROUND OF THE INVENTION

1. Field of the Invention

The invention relates to a smart card. In such cards, a module including the semiconductor chip is permanently fixed in a cavity in the card. The card itself can be molded from a plastic as a single piece. Preferably, the plastic is molded so as to form the cavity for the semiconductor chip. Alternatively, the card can consist of multiple layers connected to one another by lamination. In this case, the cavity is cut into the card.

2. Description of the Prior Art

A module to be implanted in a smart card of this type is described in German Reference DE 37 23 547. The module is fixed in the cavity of the card by means of a heat adhesive layer. To activate the heat adhesive layer and establish the adhesive connection, the layer must be heated at least briefly to relatively high temperatures, in some cases up to 150° C. To this end, the module is implanted in the card by means of a heat punch. It is disadvantageous, first of all, that the card experiences plastic deformation in the cavity region due to the heat. This detracts from the optical impression of the card surfaces, which bear high-quality printing. Secondly, it is difficult and expensive to find and duplicate the optimal parameters for the implantation process (temperature of heat punch, duration of heat, geometry of punch, etc.). Furthermore, a special problem arises in processing semiconductor chips of various sizes, because the heat absorbed by the chips and the heat conducted to the heat adhesive layer depends on the size of the semiconductor chip. Incorrectly set parameters thus result in poor adhesion. Under certain circumstances, the adhesion is so inadequate that the module can be removed from the card very easily. In addition, overheating the sensitive semiconductor module can impair its function.

Furthermore, it is known from German reference DE 42 29 639 to fix modules of this type in cards by means of instant adhesives based on cyanoacrylate. However, since such adhesives take only seconds to harden, they cannot be applied to one or both of the surfaces to be connected until immediately before the module and the card are put together. This requires an additional process step linked directly to the implantation step in terms of time (and thus in terms of space as well). When instant adhesives are used, it is therefore not possible to provide mass-produced modules with adhesive layers and then store them for days or weeks prior to the actual implantation process.

SUMMARY OF THE INVENTION

The object of the present invention is to provide a smart card, wherein the module can be implanted in the card simply and reliably and connected securely to the card in a permanent fashion, while the disadvantages described above are avoided.

Pursuant to this object, and others which will become apparent hereafter, one aspect of the present invention resides in a pass card comprised of a card body having a cavity therein, a module with a semiconductor chip implanted permanently in the cavity of the card body, and micro-encapsulated adhesive means for fixing the module in the card body.

In the smart card according to the invention, the module including the semiconductor chip is fixed in the card by means of a micro-encapsulated adhesive. To activate the adhesive process, the microcapsules containing the adhesive are ruptured by pressure. The module is implanted into the card with the help of a punch, whereupon the microcapsules containing the adhesive break (burst) and the adhesive process can be implemented without the use of heat.

As this is done, none of the aforementioned problems resulting from heat during the adhesive process are experienced.

For mass production, the finished modules (electrical contact surfaces, semiconductor chips, bonding wires between semiconductor chips and contact surfaces, encapsulant over semiconductor chips and bonding wires) are usually arranged in a substrate or an endless substrate strip. The modules to be implanted in the card are punched out of the substrate or substrate strip. The adhesive mass based on a micro-encapsulated adhesive can be applied to the substrate long before the implantation of the module into the card. The substrate is then provided with a non-adhesive top coat and can be stored for weeks or months. This is another important advantage of the micro-encapsulated adhesive.

The encapsulant mounds with the semiconductor chips can be recessed in the adhesive mass top coat in the event that the module is to adhere only at the edges.

The invention is described in greater detail below in reference to the accompanying drawings.

DETAILED DESCRIPTION OF THE PREFERRED EMBODIMENTS

Figure 1:
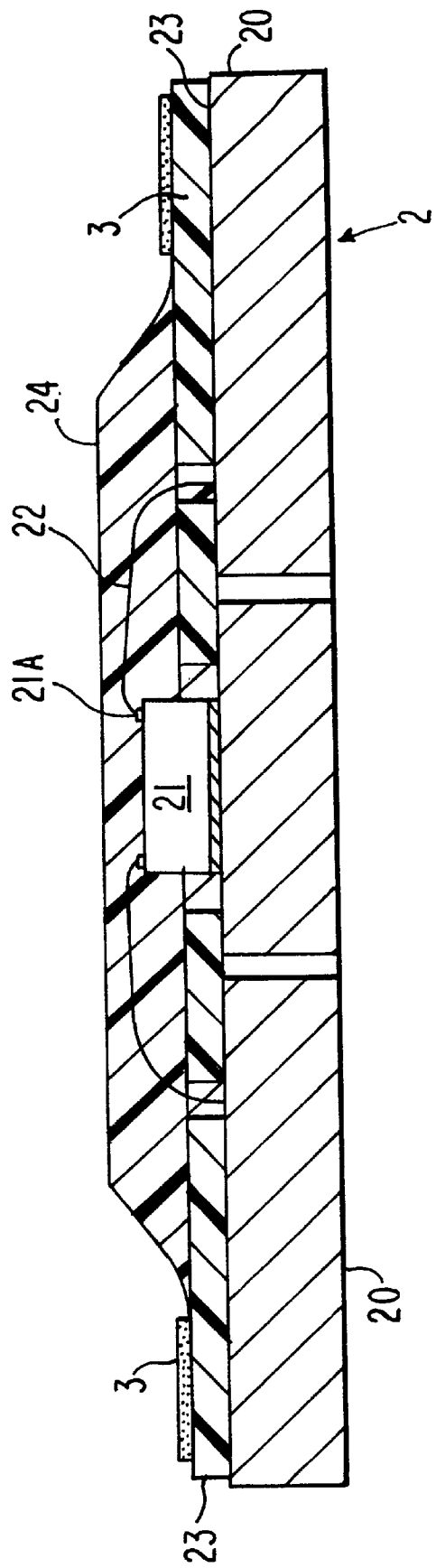
FIG. 1 is a section through a module with an applied micro-encapsulated adhesive pursuant to the present invention, prior to implantation into the card.
Figure 2:
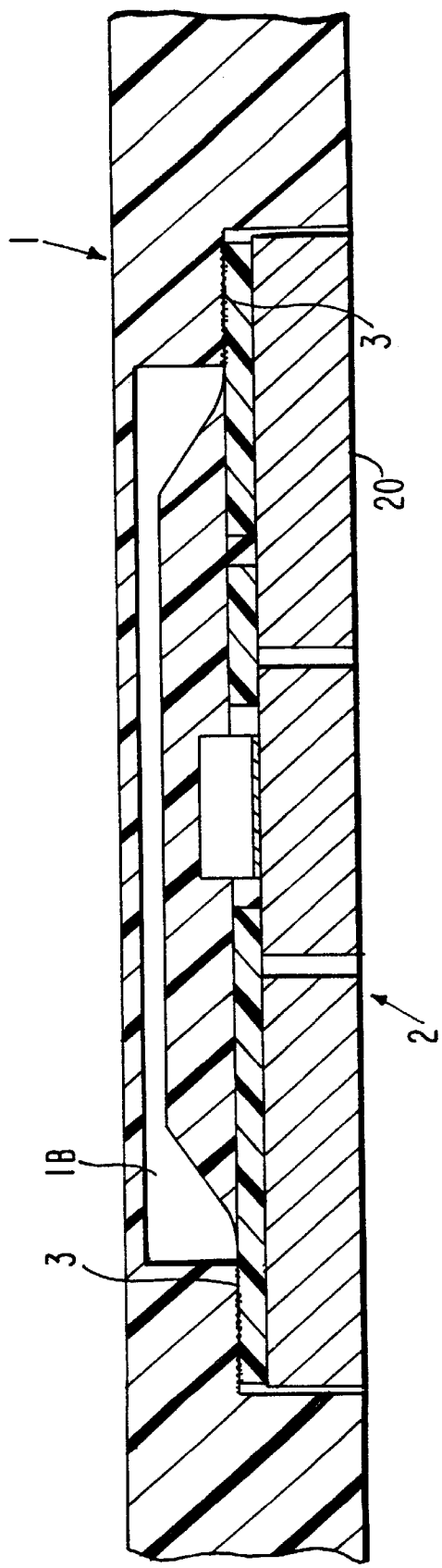
FIG. 2 is a section through a module permanently fixed in the card by means of a micro-encapsulated adhesive.

FIG. 1 shows a module (2) for a semiconductor chip (21) to be implanted into the cavity (1B) of a card body of a smart card (1) shown in FIG. 2. This module (2) consists of electrical write-read contacts (20), which are conductively connected via bonding wires (22) to corresponding connection points (21A) on the semiconductor chip (21). The write-read contacts (20) are arranged on a non-conductive plastic substrate (23). The semiconductor chip (21) and the bonding wires (22) are surrounded by a protective encapsulant (24). On the plastic substrate (23), a micro-encapsulated adhesive (3) is applied on both sides of the encapsulant mound (24).

FIG. 2 shows the module (2), which is fixed in the card body cavity (1B) by means of the micro-encapsulated adhesive (3) under pressure. To this end, the module (2) is implanted into the card body using a punch, whereupon the microcapsules containing the adhesive break or burst and the adhesive (3) is activated.

Figure 3:
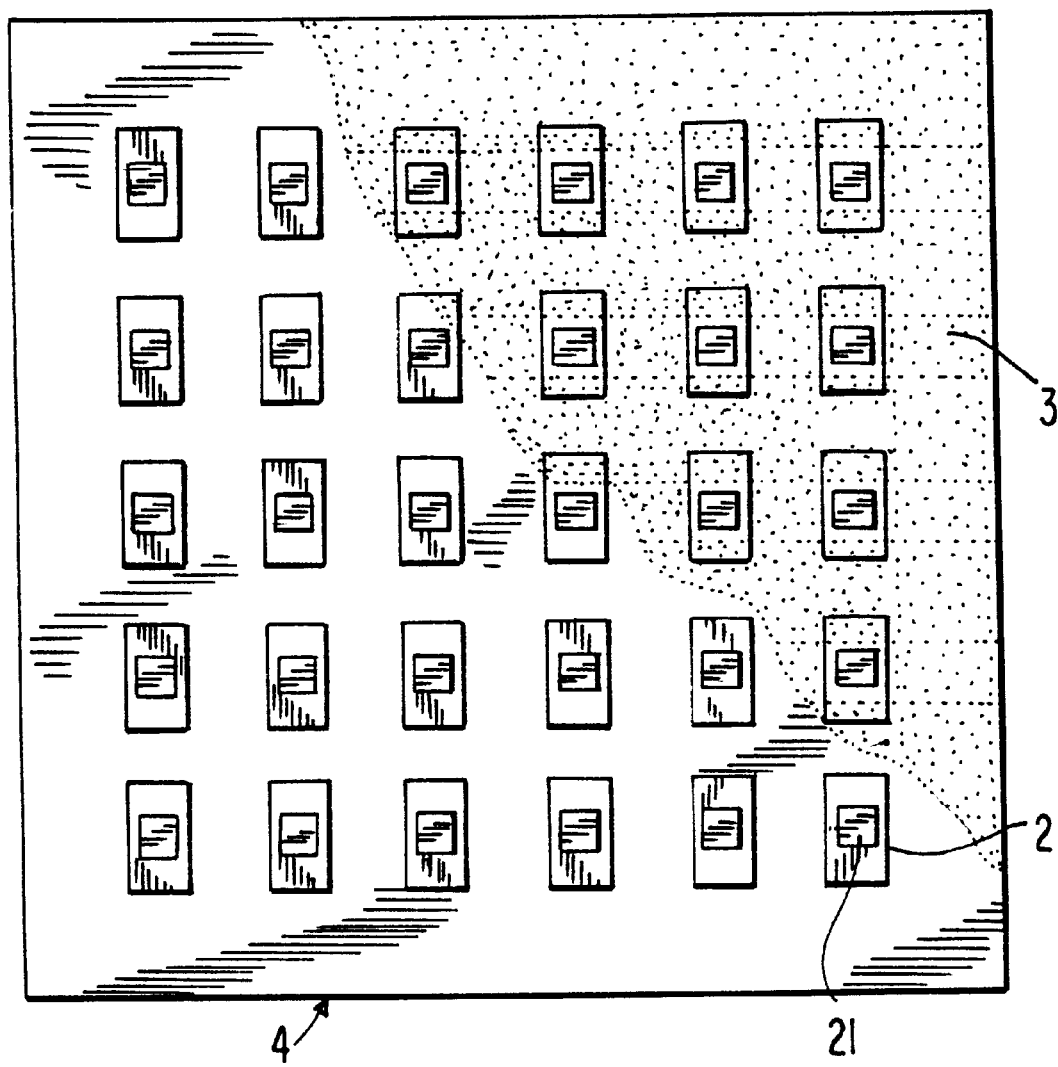
FIG. 3 is a top view of a substrate with modules that is coated with an adhesive based on a micro-encapsulated adhesive.

FIG. 3 shows a substrate (4) with a plurality of modules (2). This substrate (4) is coated with an adhesive mass (3) based on a micro-encapsulated adhesive (for clarity, the coating is shown on a partial area only). The substrate (4)

coated with the micro-encapsulated adhesive (3) can be stored for weeks or months without impairing the quality of the adhesive (3).

In one embodiment, the microcapsules containing the adhesive are dispersed in a thermoplastic binding agent. Preferably, a binding agent that is solid at room temperature and can be converted into the molten state at a slightly increased temperature is selected. Advantageously, the initially inactive adhesive layer (3) can be laminated onto the substrate (4), whereby the pressure needed to do so is not enough to break the microcapsules.

In a second embodiment, the microcapsules, together with the binding agent, are contained in a volatile organic solvent. The inactive adhesive (3) can then be sprayed or pressed onto the substrate (4).

For the adhesive material itself, different variants are foreseen. In a first variant, the micro-encapsulated adhesive is a single-component adhesive, for example, a cold-hardening adhesive based on cyanoacrylate. In a second variant, the micro-encapsulated adhesive is a two-component adhesive; in this case, either one or both of the components are encapsulated. Preferably, a cold-hardening or warm-hardening two-component adhesive based on epoxy resin is used as the two-component adhesive.

The capsules are spherical or elliptical bodies with diameters of less than 0.1 mm.

Figure 4:
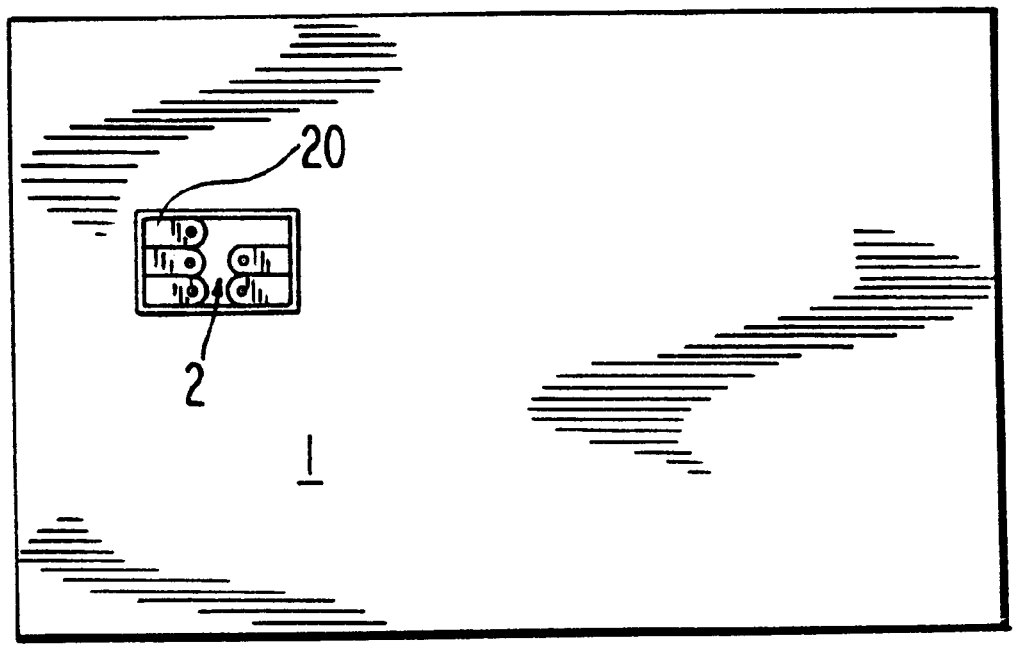
FIG. 4 is a top view of a smart card with the electrical contact surfaces of the module.

FIG. 4 shows in more detail the arrangement of the write-read contacts (20) of the module (2).

I claim:

1. A pass card, comprising: a card body having a cavity therein; a module with a semiconductor chip implanted permanently in the cavity of the card body, the module having a non-conductive plastic substrate; and micro-encapsulated adhesive means for fixing only the non-conductive plastic substrate of the module to the card body, the adhesive means including micro-capsules containing adhesive.

2. A pass card as defined in claim 1, wherein the microcapsules are homogeneously dispersed in a thermoplastic binding agent that is solid at room temperature and can be brought into a molten state at a slightly increased temperature.

3. A pass card as defined in claim 1, wherein the adhesive means includes micro-capsules containing adhesive, and a binding agent, the micro-capsules and the binding agent being contained in a volatile organic solvent.

4. A pass card as defined in claim 1, wherein the micro-encapsulated adhesive means is a single-component adhesive.

5. A pass card as defined in claim 1, wherein the adhesive means includes a two component adhesive, one component of which is encapsulated.

6. A pass card as defined in claim 1, wherein the adhesive means includes a two-component adhesive in which both components are encapsulated.

7. A pass card as defined in claim 5, wherein the adhesive means is one of a cold-hardening and a warm-hardening two-component adhesive based on epoxy resin.

8. A pass card as defined in claim 6, wherein the adhesive is one of a cold-hardening and a warm-hardening two-component adhesive based on epoxy resin.

9. A pass card as defined in claim 1, wherein the micro-encapsulated adhesive means is sprayed on.

10. A module with a semiconductor chip for implantation into a card body of a smart card, comprising a micro-encapsulated adhesive on a side of the module that is to be connected to the card body.

11. A card body for a smart card, which card body is configured to have a cavity for accommodating a module with a semiconductor chip, the card body comprising a micro-encapsulated adhesive in a region of the cavity.

* * * * *